United States Patent
Schoormans et al.

(10) Patent No.: US 10,444,635 B2
(45) Date of Patent: Oct. 15, 2019

(54) LITHOGRAPHIC METHOD AND APPARATUS

(71) Applicant: ASML Netherlands B.V., Veldhoven (NL)

(72) Inventors: Carolus Johannes Catharina Schoormans, Hooge Mierde (NL); Johannes Jacobus Matheus Baselmans, Oirschot (NL); Engelbertus Antonius Fransiscus Van Der Pasch, Oirschot (NL); Johannes Aldegonda Theodorus Marie Van Den Homberg, Nederweert (NL); Maksym Yuriiovych Sladkov, Veldhoven (NL); Andreas Johannes Antonius Brouns, Eindhoven (NL); Alexander Viktorovych Padiy, Geldrop (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/098,350

(22) PCT Filed: Apr. 5, 2017

(86) PCT No.: PCT/EP2017/058057
§ 371 (c)(1),
(2) Date: Nov. 1, 2018

(87) PCT Pub. No.: WO2017/190905
PCT Pub. Date: Nov. 9, 2017

(65) Prior Publication Data
US 2019/0163072 A1    May 30, 2019

(30) Foreign Application Priority Data
May 4, 2016 (EP) .................................. 16168284

(51) Int. Cl.
G03B 27/32 (2006.01)
G03F 7/20 (2006.01)
G03F 9/00 (2006.01)

(52) U.S. Cl.
CPC ........ *G03F 7/70516* (2013.01); *G03F 7/7085* (2013.01); *G03F 7/70725* (2013.01); *G03F 7/70775* (2013.01); *G03F 9/7019* (2013.01)

(58) Field of Classification Search
CPC .......... G01D 5/34; G01D 5/38; G03F 9/7019; G03F 9/7049; G03F 9/7069;
(Continued)

(56) References Cited

U.S. PATENT DOCUMENTS 4,815,850 A * 3/1989 Kanayama ............... G01D 5/38
356/488
5,917,604 A * 6/1999 Dirksen ................... G03F 9/70
257/E23.179

(Continued)

FOREIGN PATENT DOCUMENTS

EP    2 131 243 A2    12/2009
JP    2000-089483 A    3/2000
(Continued)

OTHER PUBLICATIONS

International Search Report and Written Opinion of the International Searching Authority directed to related International Patent Application No. PCT/EP2017/058057, dated Jul. 19, 2017; 10 pages.

*Primary Examiner* — Christina A Riddle
(74) *Attorney, Agent, or Firm* — Sterne, Kessler, Goldstein & Fox P.L.L.C.

(57) ABSTRACT

A lithographic method for measuring a position of a target grating with a mask sensor apparatus which comprises a plurality of detector modules each comprising a diffraction grating located at a mask side of a projection system of a
(Continued)

lithographic apparatus and an associated detector, the method comprising a first step of measuring first intensities of a combination of diffraction orders diffracted from the target grating while the mask sensor apparatus is moved relatively to the target grating along a first direction; a second step of displacing the mask sensor apparatus relative to the target grating in a second direction, wherein a size of the relative displacement is proportional to a spatial frequency of a potential error; and a third step of measuring second intensities of the combination of diffraction orders diffracted from the target grating while the mask sensor apparatus is moved relatively to the target grating along the first direction.

15 Claims, 12 Drawing Sheets

(58) Field of Classification Search
CPC .. G03F 9/7088; G03F 9/7092; G03F 7/70516; G03F 7/70191; G03F 7/70308; G03F 7/70316; G03F 7/70725; G03F 7/70775; G03F 7/70825; G03F 7/70833; G03F 7/7085; G03F 7/709; G03F 7/707; G03F 7/70716

USPC ............... 355/52, 53, 55, 67–71, 72–77; 356/399–401, 615–616, 622, 486, 488, 356/521; 250/492.1, 492.2, 493.1
See application file for complete search history.

(56) References Cited

U.S. PATENT DOCUMENTS

| | | | |
|---|---|---|---|
| 2004/0174536 A1* | 9/2004 | Jourlin | G01D 5/38 356/521 |
| 2009/0296058 A1* | 12/2009 | Slotboom | G03F 7/70516 355/53 |
| 2010/0020330 A1 | 1/2010 | Owen | |
| 2013/0230797 A1 | 9/2013 | Van Der Sanden et al. | |
| 2015/0227060 A1* | 8/2015 | Beerens | G01D 5/38 355/30 |
| 2018/0348647 A1* | 12/2018 | Schoormans | G03F 1/42 |

FOREIGN PATENT DOCUMENTS

| | | |
|---|---|---|
| WO | WO 97/35234 A1 | 9/1997 |
| WO | WO 2016/008656 A1 | 1/2016 |

* cited by examiner (a)

(b)

LITHOGRAPHIC METHOD AND APPARATUS

CROSS REFERENCE TO RELATED APPLICATIONS

This application claims priority of EP application 16168284.4 which was filed on 2016 May 4 and which is incorporated herein in its entirety by reference.

FIELD

The present invention relates to measuring a position of a substrate in a lithographic apparatus. In particular the present invention relates to measuring deviations in position measurements in a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

When projecting an image onto a substrate it is desirable to ensure that a substrate held on a substrate table is correctly positioned to receive the projected image. The substrate table is positioned using a positioning system which has six degrees of freedom (X, Y, Z, RX, RY, RZ). For any given position of the substrate table an error in each of the six degrees of freedom will be present. A calibration of the positioning system is performed to measure and record these errors. This calibration allows the substrate table to be accurately positioned during subsequent operation of the lithographic apparatus.

One known method of calibrating the positioning of the substrate table is to image alignment marks onto a substrate in a closely packed arrangement, and then to develop the imaged alignment marks and measure their positions. This method is very time consuming, and may for example require several hours.

Additionally, to increase the accuracy of the calibration process, several sub-calibrations may be performed. For example, separate calibrations may be carried out for different spatial frequency portions of the alignment marks. In such an example, the spatial high frequency portion may be calibrated using so-called "plate maps", the mid frequency portion may be calibrated using the multi-probe techniques using an alignment sensor on an arrangement of imaged alignment marks, and the low frequency part may be calibrated by measuring a reference substrate as well as using as the above-mentioned imaged alignment marks using an alignment sensor. In some instances, separate calibrations present have to be carried out in separate locations, using different methods and/or apparatuses. Therefore, while using such a calibration process increases the accuracy, it is severely time and resource consuming.

SUMMARY

It is desirable to reduce the time required for carrying out the calibration of the positioning system. Additionally, it is desirable to reduce the complexity of the calibration process, e.g. reducing the number of specific operations carried out during the calibration process.

In accordance with a first aspect of the invention, there is provided a method for measuring a position of a target grating with a mask sensor apparatus which comprises a plurality of detector modules each comprising a diffraction grating located at a mask side of a projection system of a lithographic apparatus and an associated detector, the method comprising: a first step of measuring first intensities of a combination of diffraction orders diffracted from the target grating while the mask sensor apparatus is moved relatively to the target grating along a first direction; a second step of displacing the mask sensor apparatus relative to the target grating in a second direction, wherein a size of the relative displacement is proportional to a spatial frequency of a potential error; and a third step of measuring second intensities of the combination of diffraction orders diffracted from the target grating while the mask sensor apparatus is moved relatively to the target grating along the first direction.

The method reduces the time and resources required for carrying out the calibration of a positioning system. It enables calibrations to be carried out for all spatial frequency portions of the alignment marks, and further allows recalibration at a later stage, e.g. if part of the apparatus has been damaged.

Further, the method increases the accuracy of the calibration, which enables a more accurate setup of the individual components of the lithographic apparatus. This, in turn, reduces process-induced or apparatus-induced deviations (e.g. overlay), leading to an improvement in the quality of the patterned products.

In accordance with a second aspect of the invention, there is provided a lithographic apparatus comprising means for carrying out a method as set forth above.

The invention yet further provides a method of manufacturing devices wherein device features and measurement targets are formed on a series of substrates by a lithographic process, wherein properties of the measurement targets on one or more processed substrates are measured by a method as set forth above, and wherein the measured properties are used to adjust parameters of the lithographic process for the processing of further substrates.

The invention yet further provides a mask sensor apparatus comprising at least on diffraction grating usable in a method as set forth above.

The invention yet further provides a computer program product containing one or more sequences of machine-readable instructions for implementing a determining step in a method according to the invention as set forth above.

Further aspects, features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Before describing embodiments of the invention in detail, it is instructive to present an example environment in which embodiments of the present invention may be implemented.

Figure 1:
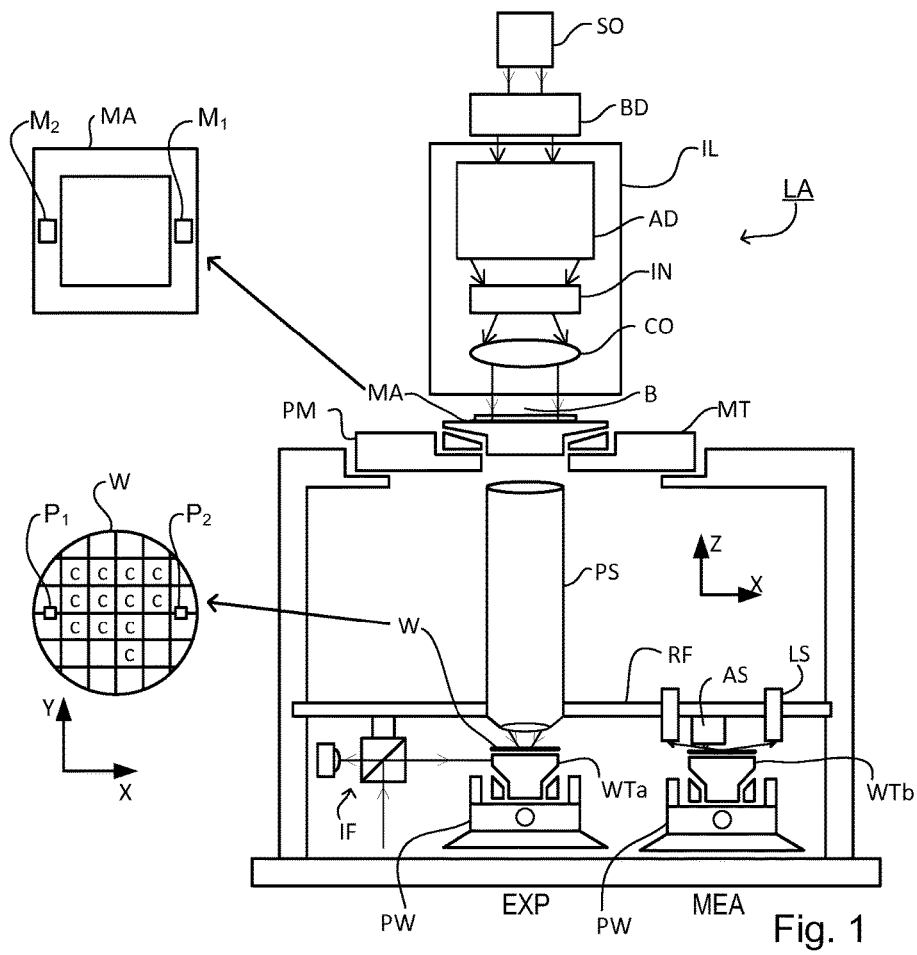
FIG. 1 depicts a lithographic apparatus.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a substrate table) WTa and WTb each constructed to hold a substrate (e.g., a resist coated substrate) W and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support MT may be a frame or a table, for example, which may be fixed or movable as required. The patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment mark may also be included within dies, in amongst the device features, in which case it is desirable that the markers be as small as possible and not require any different imaging or process conditions than adjacent features. The alignment system, which detects the alignment markers is described further below.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The speed and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. This enables a substantial increase in the throughput of the apparatus. The preparatory steps may include mapping the surface height contours of the substrate using a level sensor LS and measuring the position of alignment markers on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

Figure 2:
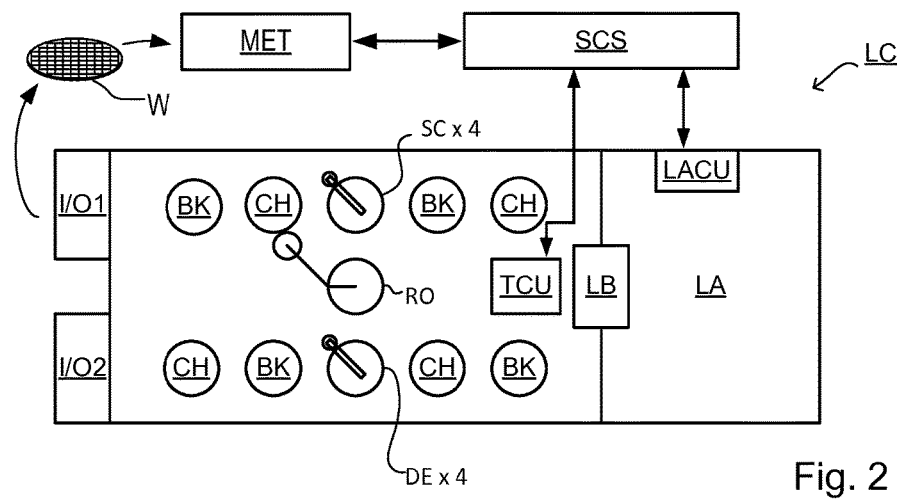
FIG. 2 depicts a lithographic cell or cluster in which a lithographic apparatus according to the present invention may be used.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency. The substrates processed by the track are then transferred to other processing tools for etching and other chemical or physical treatments within the device manufacturing process.

The lithographic apparatus control unit LACU controls all the movements and measurements of the various actuators and sensors described. LACU also includes signal processing and data processing capacity to implement desired calculations relevant to the operation of the apparatus. In the terminology of the introduction and claims, the combination of these processing and control functions referred to simply as the "controller". In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these subsystems processing units, with operators and with other apparatuses involved in the lithographic manufacturing process.

Figure 3:
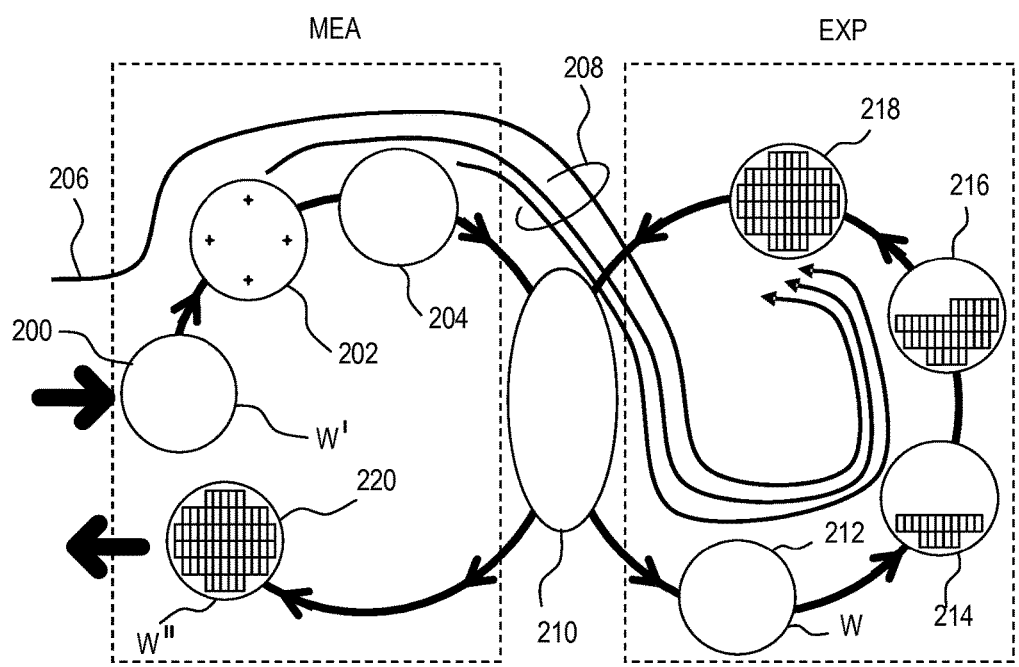
FIG. 3 illustrates steps to expose target portions on a substrate in the dual stage apparatus of FIG. 1.

FIG. 3 illustrates the steps to expose target portions (e.g. dies) on a substrate W in the dual stage apparatus of FIG. 1.

On the left hand side within a dotted box are steps performed at a measurement station MEA, while the right hand side shows steps performed at the exposure station EXP. From time to time, one of the substrate tables WTa, WTb will be at the exposure station, while the other is at the measurement station, as described above. For the purposes of this description, it is assumed that a substrate W has already been loaded into the exposure station. At step 200, a new substrate W' is loaded to the apparatus by a mechanism not shown. These two substrates are processed in parallel in order to increase the throughput of the lithographic apparatus.

Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well. Particularly for the problem of improving overlay performance, the task is to ensure that new patterns are applied in exactly the correct position on a substrate that has already been subjected to one or more cycles of patterning and processing. These processing steps progressively introduce distortions in the substrate that must be measured and corrected for, to achieve satisfactory overlay performance.

The previous and/or subsequent patterning step may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

At 202, alignment measurements using the substrate marks P1 etc. and image sensors (not shown) are used to measure and record alignment of the substrate relative to substrate table WTa/WTb. In addition, several alignment marks across the substrate W' will be measured using alignment sensor AS. These measurements are used in one embodiment to establish a "wafer grid", which maps very accurately the distribution of marks across the substrate, including any distortion relative to a reference element. Typically, the reference element may take the shape of a rectangular grid, although other advantageous or convenient reference elements may, in principle, also be envisaged.

At step 204, a map of wafer height (Z) against X-Y position is measured also using the level sensor LS. Conventionally, the height map is used only to achieve accurate focusing of the exposed pattern. The height map data may in some examples be used to supplement the alignment measurements.

When substrate W' was loaded, recipe data 206 were received, defining the exposures to be performed, and also properties of the wafer and the patterns previously made and to be made upon it. To these recipe data are added the measurements of wafer position, wafer grid and height map made at 202, 204, so that a complete set of recipe and measurement data 208 can be passed to the exposure station EXP. The measurements of alignment data for example comprise X and Y positions of alignment targets formed in a fixed or nominally fixed relationship to the product patterns that are the product of the lithographic process. These alignment data, taken just before exposure, are combined and interpolated to provide parameters of an alignment model. These parameters and the alignment model will be used during the exposure operation to correct positions of patterns applied in the current lithographic step. A conventional alignment model might comprise four, five or six parameters, together defining translation, rotation and scaling of the 'ideal' grid, in different dimensions. As described further in US 2013230797A1, advanced models are known that use more parameters.

At 210, wafers W' and W are swapped, so that the measured substrate W' becomes the substrate W entering the exposure station EXP. In the example apparatus of FIG. 1, this swapping is performed by exchanging the supports WTa and WTb within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table WTb (formerly WTa) is all that is necessary to make use of the measurement information 202, 204 for the substrate W (formerly W') in control of the exposure steps. At step 212, reticle alignment is performed using the mask alignment marks M1, M2. In steps 214, 216, 218, scanning motions and radiation pulses are applied at successive target locations across the substrate W, in order to complete the exposure of a number of patterns.

By using the alignment data and height map obtained at the measuring station in the performance of the exposure steps, these patterns are accurately aligned with respect to the desired locations, and, in particular, with respect to features previously laid down on the same substrate. The exposed substrate, now labeled W" is unloaded from the apparatus at step 220, to undergo etching or other processes, in accordance with the exposed pattern.

Figure 4:
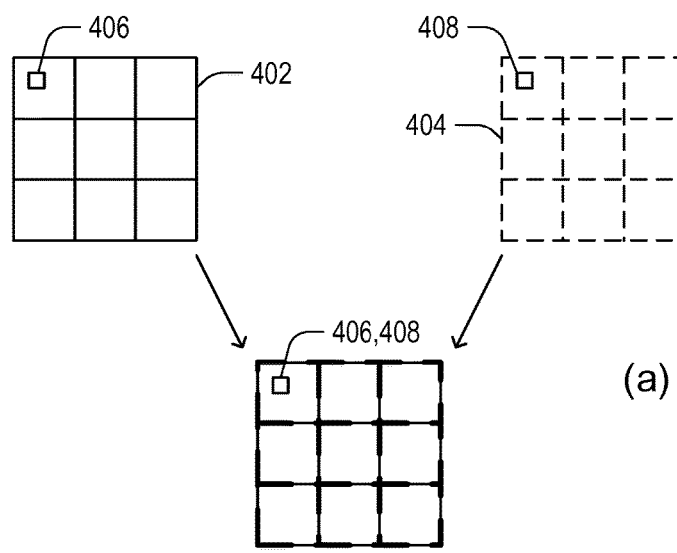
FIG. 4 depicts schematically first and second reference grids that may be used in the lithographic apparatus.
Figure 4:
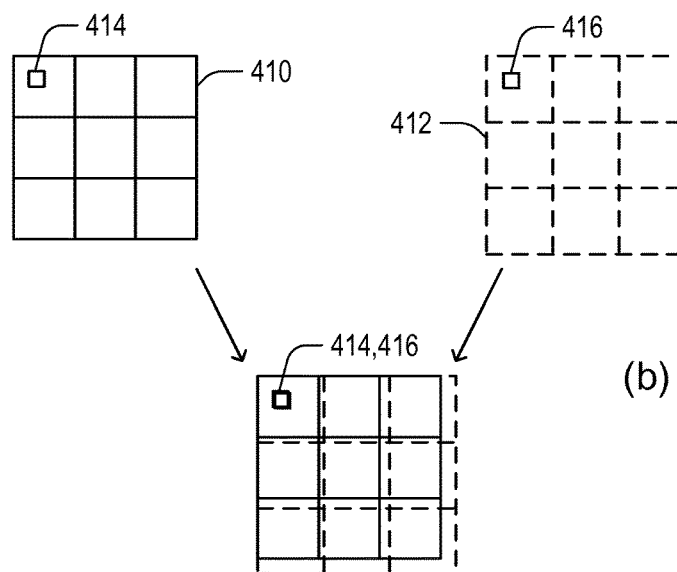

As mentioned above, alignment at the measurement station is carried out with reference to a fixed reference element, such as a rectangular grid placed on a reference grid plate. Similarly, alignment measurements performed at the exposure station may be performed with reference to an identical reference grid. In this fashion, any position measurement made at the measurement station is directly transferrable to the exposure station. This is illustrated in FIG. 4(*a*), where a first reference grid 402, which is used at the measurement station, is identical to a second reference grid 404, which is used at the exposure station. A first exemplary target 406 is located at a particular set of coordinates with respect to the first reference grid. Similarly, a second exemplary target 408 is located at the same set of coordinates, but with respect to the second reference grid. In this situation, when the reference grids are overlaid, the positions of the targets are identical.

However, in reality, there may be minute variations between the reference grid at the measurement station and the reference grid at the exposure station. FIG. 4(*b*) illustrates an exemplary situation, wherein the second reference grid 412 at the exposure station is larger than the first reference grid 410 at the measurement station. It will of course be realized that this is purely for exemplary purposes, and that the variations between the first and second reference grid may be more complex. In this situation, similarly to the one shown in FIG. 4(*a*), the first exemplary target 414 has a particular set of coordinates with respect to the first reference grid 410, and the second exemplary target 416 has the same set of coordinates with respect to the second reference grid 412.

However, since the second reference grid is larger than the first reference grid, the exemplary targets do not overlap if the reference grids are overlaid. In other terms, a position measured at the first reference grid is not directly transferrable to the second reference grid. In mathematical terms, a position p=(x, y) determined with reference to the first reference grid will be p=(x+δx, y+δy). If the difference in coordinates is not taken into account, the accuracy of the processing steps may be reduced, thereby decreasing the quality of substrates produced in the lithographic apparatus.

Figure 5:
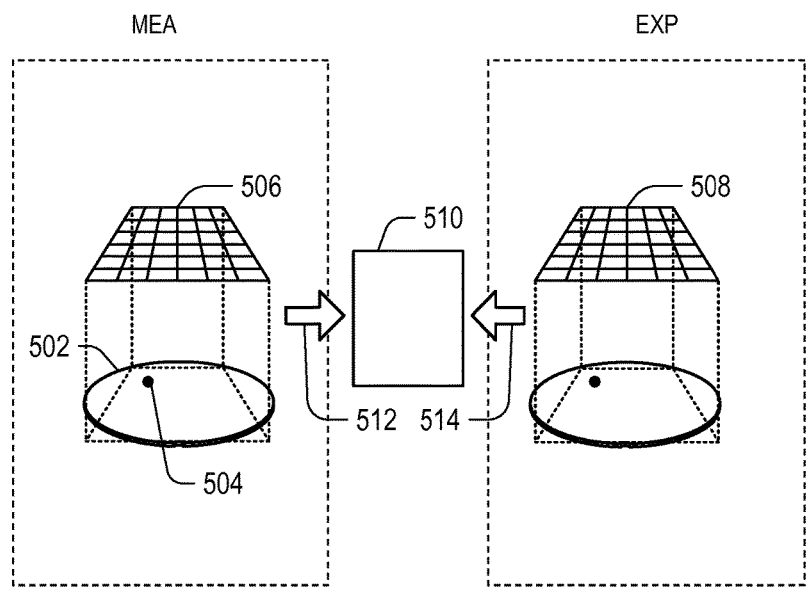
FIGS. 5 and 6 schematically depict a measurement method according to an embodiment of the invention.
Figure 6:
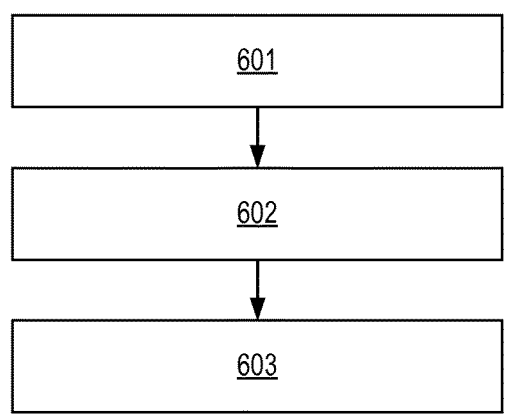

An exemplary method will now be discussed with reference to FIGS. 5 and 6. In a first step 601, a first position measurement is performed on a substrate 502 in order to determine a first position of a first measurement target 504 relative to a first reference element 506. The position measurement is performed at the measurement station MEA of a lithographic apparatus, substantially as described above.

In a second step 602, a second position measurement is performed on the substrate 502 to determine a second position of the first measurement target 504 relative to a second reference element 508. As described above, the second position measurement will typically be performed at the exposure station of the lithographic apparatus.

In a third step 603, a characteristic of the first reference element relative to the second reference element is determined based on first position data 512 obtained during the first position measurement and on second position data 514 obtained during the second position measurement. The determination may, for example, be carried out by a processing unit 510 to which the position data has been transmitted. In some examples, the determination may be carried out by the lithographic apparatus control unit (LACU) described above. In other examples, the lithographic apparatus may comprise a processing unit dedicated to carrying out the determination. In yet other examples, the determination may be carried out by a remotely located processing unit, and the position data may be transmitted to the remote processing unit.

The alignment measurement at the measurement station is typically carried out using the alignment sensor AS (as discussed with reference to FIG. 1). The alignment measurement at the exposure station may be carried out by using a so-called mask sensor apparatus, the operation of which will now be explained.

In summary, a method for measuring deviations between reference elements in a lithographic apparatus comprises the steps of: performing a first position measurement to determine a first position of at least one measurement target relative to a first reference element; performing a second position measurement to determine a second position of the at least one measurement target relative to a second reference element; and determining a characteristic of the first reference element relative to the second reference element based on the first and second position measurements. Determining a characteristic may comprise determining a deviation between the first reference element and the second reference element. The first reference element and the second reference element may comprise grid reference elements.

Figure 7:
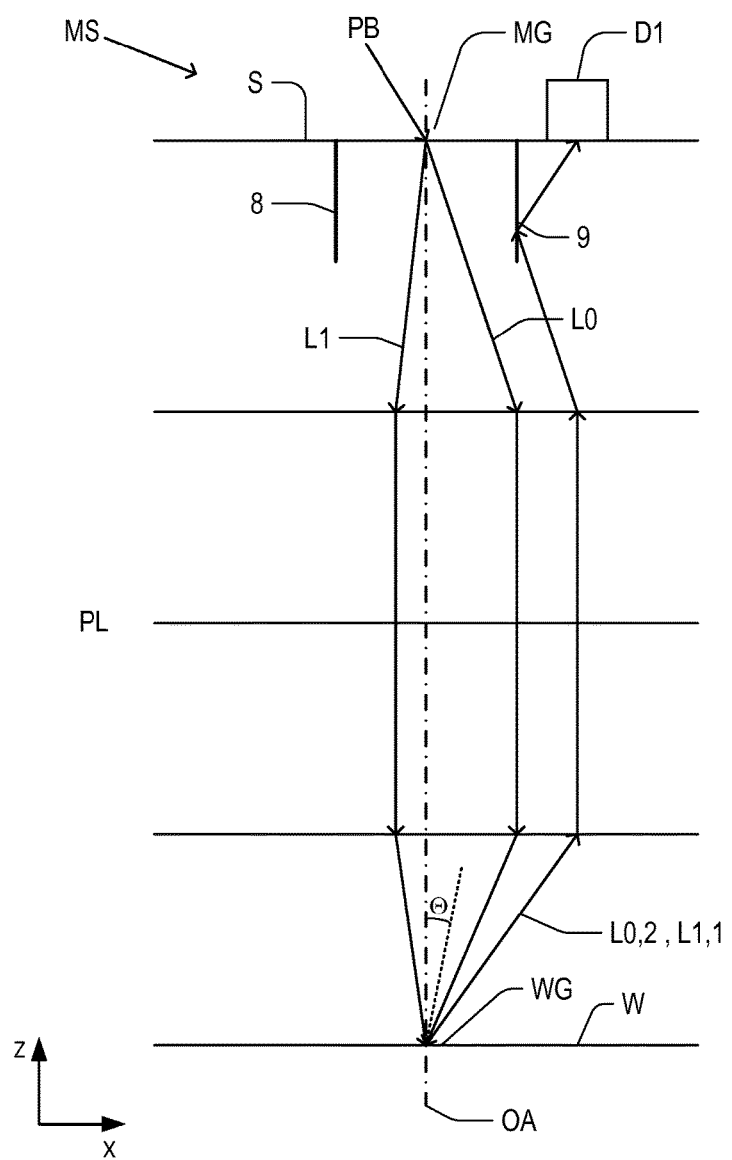
FIG. 7 depicts schematically part of the lithographic apparatus and a measurement method.

FIG. 7 illustrates schematically an example of how a mask sensor apparatus may be used to generate a combined diffraction order which, when measured by a detector D1 can be used to determine the position of a substrate diffraction grating WG. The mask sensor apparatus MS comprises a mask substrate S upon which a diffraction grating MG, a detector D1 and a pair of walls 8,9 are provided. The mask sensor apparatus MS is located on the mask side of the projection system PL of the lithographic apparatus (i.e. where a mask would be located during normal operation of the lithographic apparatus). A radiation beam PB is incident on the mask diffraction grating MG. The radiation beam is generated by the source SO (see FIG. 1). Thus, the radiation beam is actinic radiation with a wavelength which corresponds with the wavelength that will be used by the lithographic apparatus to expose substrates during production (e.g. 193 nm). The radiation beam is a dipole (or quadrupole) mode, only one pole of which is shown for simplicity. The mask diffraction grating diffracts the radiation beam to form a zero diffraction order L0 and a first diffraction order L1. These two diffraction orders L0, L1 propagate through the projection system PL and are focused by the projection system onto a substrate W. Other diffraction orders are generated but these are either blocked by the walls 8,9 (the walls act as a filter which filters out unwanted diffraction orders) or fall outside of the numerical aperture of the projection system PL. The substrate W is provided with a diffraction grating WG which diffracts the incident radiation. Although several diffraction orders may be generated only two diffraction orders are illustrated. The first illustrated diffraction order is the second diffraction order of the substrate grating WG generated from the zero order radiation diffracted by the mask grating MG. This is identified by L0,2. The second illustrated diffraction order is the first diffraction order of the substrate grating WG generated from the first order radiation diffracted by the mask grating MG. This is identified by L1,1. These two diffraction orders L0,2, L1,1 co-propagate together (they are collinear). The two diffraction orders L0,2, L1,1 may be referred to as a combination diffraction order (or combination order). The combination order L0,2, L1,1 propagates back through the projection system PL. The combination order L0,2, L1,1 is then incident upon a reflective surface M1 of the wall 9, which directs the combination order to the detector D1. The detector D1 is an intensity detector and measures the intensity of the combination order L0,2, L1,1. Other diffraction orders (including combination orders) may propagate back through the projection system PL, but these other orders are not incident upon the reflective surface of the wall 9 and thus are not incident upon the detector D1. The wall 9 thus again acts as a filter, this time selecting the combination order L0,2, L1,1 and excluding other diffraction orders. The walls 8,9 therefore act as filters twice, once for radiation which has been diffracted from the mask grating MG and once for radiation which has been diffracted from the substrate grating WG.

The intensity of the combination order L0,2, L1,1 depends upon the relative alignment between the substrate grating WG and the aerial image of the mask grating MG formed by the incident diffraction orders L0 and L1. Alignment of bright lines of the mask grating aerial image with reflective portions of the substrate grating will generate a high intensity at the detector D1. Conversely, alignment of dark lines of the mask grating aerial image with reflective portions of the substrate grating will generate a low intensity at the detector D1. Thus, movement of the substrate grating WG (and substrate) in the X-direction will change the relative alignment of bright lines of the mask grating aerial image and reflective portions of the substrate grating, and will cause the intensity of the combination order to vary in a sinusoidal manner. Although grating lines are referred to here the same applies to gratings which are not formed from lines (e.g. gratings which extend in two directions such as checkerboard type gratings).

Since the aerial image of the mask grating is formed by two diffraction orders L0, L1 which are not symmetric about the optical axis of the projection system PL, the aerial image is tilted with respect to the optical axis. The angle of tilt of the aerial image bisects the two incident diffraction orders L0, L1 and is denoted in FIG. 7 as Θ. Due to the angle of tilt Θ of the mask grating aerial image, the relative alignment of bright lines of the aerial image and reflective portions of the substrate grating will vary as a function of the Z-direction position of the substrate grating (i.e. the position of the substrate grating relative to the focal plane of the projection system). Again, although grating lines are referred to here, the same applies to gratings which are not formed from lines.

As is explained further below, when multiple detectors are used, a movement in the Z-direction will generate signals at the detectors which are different from the signals generated by a movement in the X-direction. This allows discrimination between Z-direction measurements and X-direction measurements.

Figure 8:
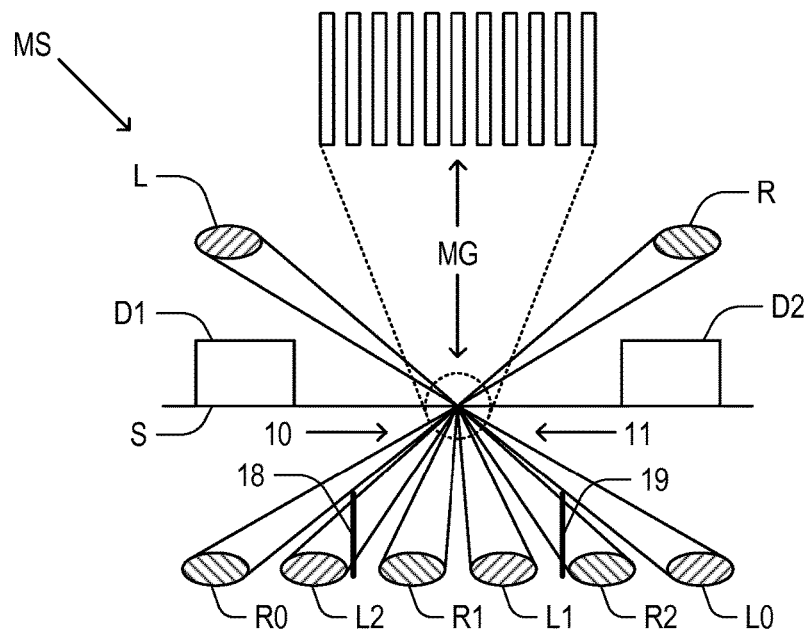
FIGS. 8-10 depict schematically generation and measurement of diffraction orders.

A modified arrangement of the mask sensor apparatus MS is shown schematically in FIG. 8. The mask sensor apparatus of FIG. 8 is arranged to transmit and detect different diffraction orders from the mask sensor apparatus of FIG. 7. In common with the embodiment shown in FIG. 7, the mask sensor apparatus MS shown in FIG. 8 comprises a mask substrate S and a diffraction grating MG. Instead of showing a single pole of incident radiation and a single detector, FIG. 8 shows two incident poles L,R and two detectors D1, D2. An expanded view of a mask diffraction grating MG viewed from above is included in FIG. 8. Walls 18, 19 extend below the mask substrate S and include openings 10, 11 which allow passage of radiation between the openings and the mask substrate S. Due to the schematic nature of FIG. 8 and for simplicity of illustration, the manner in which the walls 18, 19 are connected to the mask substrate S is not shown (this is described further below). The mask sensor apparatus MS may be provided with additional components which are omitted here for simplicity of illustration.

The mask sensor apparatus MS is illuminated using a radiation beam which comprises a dipole mode, represented schematically in FIG. 8 by first and second poles L,R. The dipole mode may have a sigma-inner of around 2/3 and a sigma-outer of around 3/3. In other words the dipole mode occupies the outer third of the numerical aperture of the projection system (this may be considered to be a relatively high sigma). The mask diffraction grating MG diffracts this incident radiation into a plurality of diffraction orders. This is schematically depicted in FIG. 8 as zero order L0, first order L1 and second order L2 which are generated from the left hand pole L of the dipole, and zero order R0, first order R1 and second order R2 which are generated from the right hand pole R of the dipole. The walls 18,19 are reflective on their outer surfaces but have inner surfaces which act to block radiation. Thus, the second order diffraction L2, R2 is blocked by the walls 18,19 (the walls 18,19 filter out the second order diffraction). In any event, the second order diffraction L2, R2 has a relatively small amplitude due to the one-to-one duty cycle of the mask diffraction grating MG. Due to the blocking effect of the reflective surfaces, only the zero orders L0, R0 and first orders L1, R1 enter the projection system PL of the lithographic apparatus (not shown) and are imaged onto a substrate. Higher diffraction orders (i.e. orders greater than the second order) fall outside the numerical aperture of the projection lens.

Figure 9:
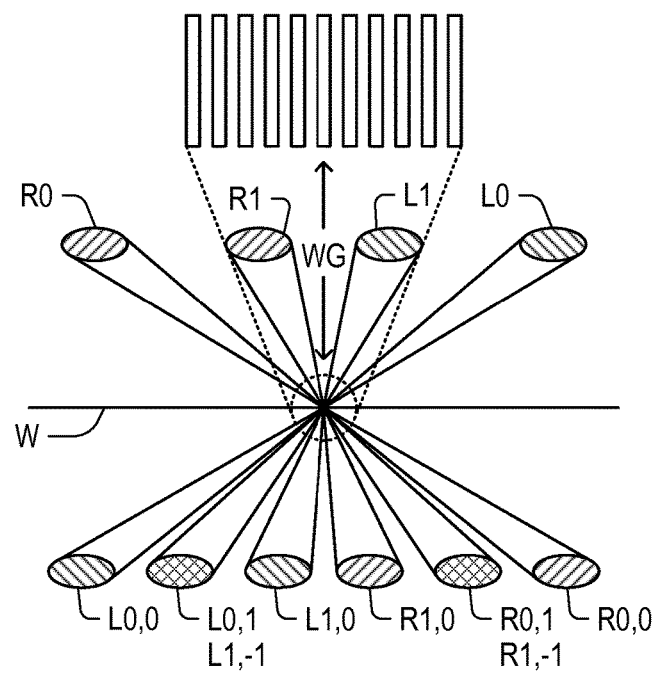
Figure 10:
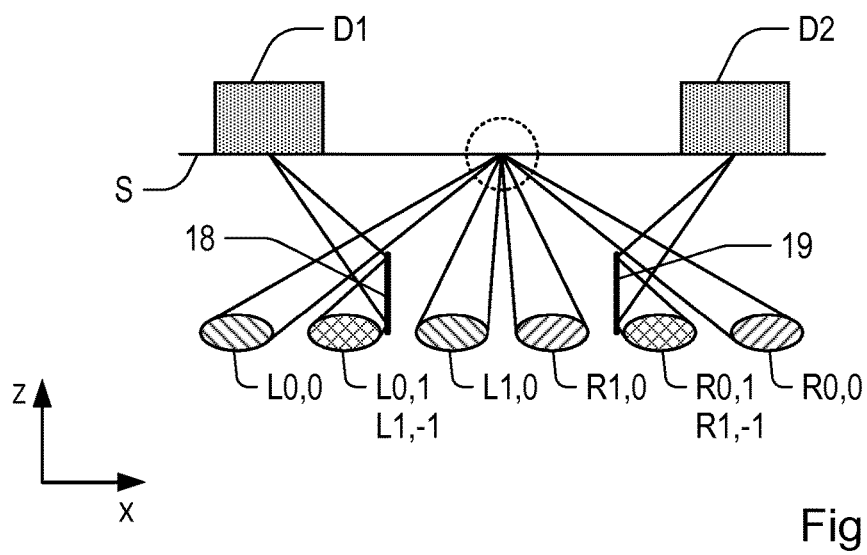

FIG. 9 shows schematically a substrate W upon which the radiation diffracted by the mask grating is incident after passing through the projection system. FIG. 10 also shows radiation which has been diffracted by a diffraction grating WG provided on the substrate. The substrate grating WG is reflective rather than transmissive, but for ease of illustration radiation which has been reflected from the substrate grating is shown beneath the substrate W. Since the substrate grating WG is reflective, the incident radiation undergoes reflection in addition to being diffracted by the substrate grating.

An expanded view of the substrate grating WG viewed from above is included in FIG. 9. The substrate grating WG is symmetrical and has a period which is double the period of the mask grating MG (ignoring the effect of a reduction factor of the projection system PL). The incident radiation comprises zero and first order radiation R0, R1, L0, L1. The substrate grating WG diffracts the incident radiation into several diffraction orders, only some of which are shown in FIG. 10. Dealing first with the zero order incident radiation L0, the first two diffracted orders generated from this radiation are shown. These are the zero order L0,0 and the first order L0,1. The second order will have a low intensity due to the one-to-one duty cycle of the substrate grating WG and is not illustrated. Since the period of the substrate grating WG is twice the period of the mask grating MG, the angular separation between diffraction orders is half of that seen for the mask grating. It will of course be appreciated that the shown orientation of the substrate grating WG is exemplary only, and that examples wherein the substrate grating has other orientations may be envisaged.

Turning to the first order incident radiation L1, this is diffracted as a zero order L1,0 and a first order L1,−1. Second order diffraction will also occur but is not shown here because it has a low intensity due to the one-to-one duty cycle of the substrate grating WG. Because the angular separation between diffraction orders is half of that seen at the mask, the first diffraction order L0,1 generated from the zero order incident radiation L0 and the first diffraction order L1,−1 generated from the first order incident radiation L1 overlap each other. The first diffraction orders L0,1 and L1,−1 are coherent with each other because they originate from the same source SO and are imaged by the projection system PL (see FIG. 1) which is diffraction limited. Thus, the overlap between the first diffraction orders L0,1 and L1,−1 generates interference. This interference is illustrated schematically by striped shading. The phase of the interference between the first diffraction orders L0,1 and L1,−1 will vary depending upon the position of the substrate grating WG, as is discussed further below. The diffraction orders L0,1 and L1,−1 are collectively be referred to as a combination diffraction order (or combination order).

The other incident radiation R0, R1 is diffracted in the same manner. Thus, the zero order incident radiation R0 is diffracted as a zero order R0,0 and a first order R0,1. The first order incident radiation R1 is diffracted as a zero order R1,0 and a first order R1,−1. The first diffraction orders R0,1 and R1,−1 overlap with each other and thus interfere with each other. The interference is illustrated schematically by striped shading. The phase of the interference between the first diffraction orders R0,1 and R1,−1 will vary depending upon the position of the substrate grating WG. The diffraction orders R0,1 and R1,−1 are collectively be referred to as a combination diffraction order (or combination order).

FIG. 10 schematically shows detection by the first detector D1 of the combination order L0,1 and L1,−1, and detection by the second detector D2 of the combination order R0,1 and R1,−1. As is schematically depicted, the walls 18,19 act to reflect only these combination orders to the detectors D1, D2. The reflective walls 18,19 are sized and positioned such that they do not reflect other diffraction orders L0,0, L1,0, R1,0 and R0,0 to the detectors D1, D2 but instead allow these to pass without reflection. Thus, only the combination orders L0,1, L1,−1, R0,1, R1,−1 are incident upon the detectors D1, D2 (other orders are filtered out by the reflective walls 18,19). No optics are needed to focus radiation into the detectors D1, D2 because the projection system already provides focusing of the radiation. Due to the reflection which occurs at the substrate grating WG, each combination order is detected at the same side as the pole of incident radiation which generated that combination order. Thus, the left hand pole L generates a combination order L0,1, L1,−1 which is detected by the left hand detector D1, and the right hand pole R generates a combination order R0,1, R1,−1 which is detected by the right hand detector.

The detectors D1, D2 are configured to detect the intensity of incident radiation (there is no need for the detectors to be imaging detectors). Since the phase of interference in the combination orders L0, L1, R0, R1 changes as a function of the position of the substrate grating WG, intensity signals output from the detectors D1, D2 may be used to measure the position of the substrate grating.

Movement of the substrate W will change the phase of the interference in the combination order L0,1 and L1,−1 and will also change the phase of the interference in the combination order R0,1 and R1,−1. As is explained further below, movement in the X-direction will cause the phase of interference in the combination orders to change with the same sign, whereas movement in the Z-direction will cause the phase of interference in the combination orders to change with opposite signs.

Another way of considering the same effect is with reference to relative alignment between the substrate grating WG and an aerial image of the mask grating MG. Movement of the substrate grating in the X-direction will cause the relative alignment of the substrate grating and the aerial image of the mask grating to change in the same manner for both detectors D1, D2. However, the aerial image of the mask grating MG generated by each pole L,R is tilted with respect to the optical axis, the tilt of the aerial image generated by the left pole L having an opposite sign from the tilt of the aerial image generated by the right pole R. As a result, movement in the Z-direction of the substrate grating will change the relative alignment between the substrate grating and the mask grating aerial images to change with opposite sign.

FIG. 11(a) schematically illustrates a mask sensor apparatus which, instead of comprising a single mask grating and associated detectors, comprises a plurality of mask gratings and associated detectors (MS1-MS7), each of which may be referred to as a module. The mask sensor apparatus is viewed from below, and comprises a mask substrate S (e.g. formed from quartz) upon which seven modules MS1-MS7 are provided. Five of the modules MS1-MS5 are provided at the center of the mask substrate S, with additional modules MS6, MS7 being provided at edges of the mask substrate S. In use, at a given moment in time the seven modules MS1-MS7 each measure the X, Y and Z position of the same substrate grating. The substrate grating extends sufficiently far in the X and Y directions that the mask grating aerial image formed from each module MS1-MS7 is incident upon that substrate grating. The substrate grating may for example extend across substantially the entirety of the substrate. The substrate is moved relative to the projection system in a phase-stepping manner such that each module MS1-MS7 measures the X,Y,Z position of the substrate grating for a variety of positions of the substrate. This provides a plurality of measurements which together may be used to distinguish between a deviation of the substrate grating from a desired location on the substrate and an error in the positioning of the substrate. It should be noted that the measured X, Y, Z positions of the substrate grating can be due to a number of deviations in the substrate stage and/or objective lens, including (but not limited to): positional deviations (in the X, Y, and Z directions); or rotational deviations around any of the three cardinal axes (referred to as Rx, Ry & Rz).

Distinguishing between deviation of the substrate grating from a desired location on the substrate and an error in the positioning of the substrate can be achieved by monitoring both the positions measured by the modules and the separation between those measured positions. For example, considering the Y-direction, during a single measurement cycle three modules MS1, MS2, MS4 measure the position of the substrate grating. These positions may be referred to as P1, P2 and P3. The controller CT (see FIG. 1) or some other processor measures the separation between these measured positions. The measured separations may be referred to as $\Delta P1,2$ and $\Delta P2,3$. Unlike the measured positions P1-P3 the measured separations $\Delta P1,2$ and $\Delta P2,3$ are independent of errors in the positioning of the substrate (this is because they are different measurements rather than absolute position measurements). Similarly, considering the X-direction, measurements of the substrate grating position and separation measurements are performed.

The separation measurements are used to create a map of the substrate grating which maps deviations of the substrate grating from desired locations across the surface of the substrate. The map may comprise vectors which indicate the direction and amplitude of substrate grating deviations across the surface of the substrate. The substrate deviations can be due to a plurality of factors. Examples include, but are not limited to: pattern deformations that occur during substrate production; or physical substrate deformations (for example caused during handling of the substrate or by the substrate stage itself).

It will of course be realized that other sources of deformations may also be mapped. Such sources include, but are not limited to: deformations of the substrate stage positioning system or individual components thereof; deformations of one or more surfaces of the substrate table; or deformations of the mask sensor apparatus. Accordingly, although the term "substrate grating deviations" is used, this is merely to be interpreted as exemplary and non-limiting.

Once the map of substrate grating deviations has been determined, the substrate grating deviations can be subtracted from the positions measured using the modules MS1-MS7. This removes the effect of the substrate grating deviations from the measured positions, such that the resulting measured positions depend solely on errors in the positioning of the substrate. Thus, a map of substrate positioning errors is thereby obtained. The map may be in the form of vectors, the vectors indicating the direction and amplitude of the positioning errors (which may also be referred to as substrate writing errors). At each substrate position (x,y) the vector has three properties $dX(x,y)$, $dY(x,y)$, $dZ(x,y)$ and thus is a vector in three dimensions.

As noted above, two of the modules MS6, MS7 are provided at edges of the mask substrate S of the mask sensor apparatus. Providing these modules MS6, MS7 with a relatively large separation in this manner is advantageous because it improves detection of low frequency changes of the height of the substrate grating. That is, the signal to noise ratio provided for such low frequency changes (e.g. a change which occurs over a few mm or even cm) is improved. Although modules MS6, MS7 are shown as being provided at edges of the mask substrate, they may for example be provided at or adjacent to edges, or beyond the edges, of the mask substrate. In general, the greater the separation between the modules MS6, MS7 the better the sensitivity to low frequency changes of the substrate grating height. A low frequency change of the substrate grating height may equivalently be thought of as a tilt of the substrate grating about the Y-direction.

Providing two modules MS6, MS7 at or adjacent to edges of the mask substrate S also improves the signal to noise sensitivity of the mask sensor apparatus to rotation of the substrate grating about the Z-direction and expansion (or contraction) of the substrate grating in the X-direction.

The modules MS1-MS7 can be positioned such that they all measure the same (relative) phase. That is, for a given measurement cycle (i.e. a single measurement by each module) each module would generate the same output if there was no deviation of the substrate grating and no error in the positioning of the substrate. In general, three measurements of a sine wave are needed in order to determine the amplitude and phase of the sine wave. Since the modules MS1-MS7 are measuring sine-wave signals, three or more measurements are required in order to characterize the measured sine wave.

In an alternative example, three modules (e.g. MS1, MS3, MS5 or MS1, MS2, MS4) can be positioned such that they perform measurements which are 120 degrees out of phase (relative to each other). That is, they are positioned such that if there was no deviation of the substrate grating and no error in the positioning of the substrate then they would generate outputs 120 degrees out of phase of each other. In such an embodiment a single measurement cycle (i.e. a single measurement by each module) provides enough information to characterize the measured sine wave. Thus, a single measurement cycle provides a substrate grating measurement in the X, Y and Z directions.

Figure 11:
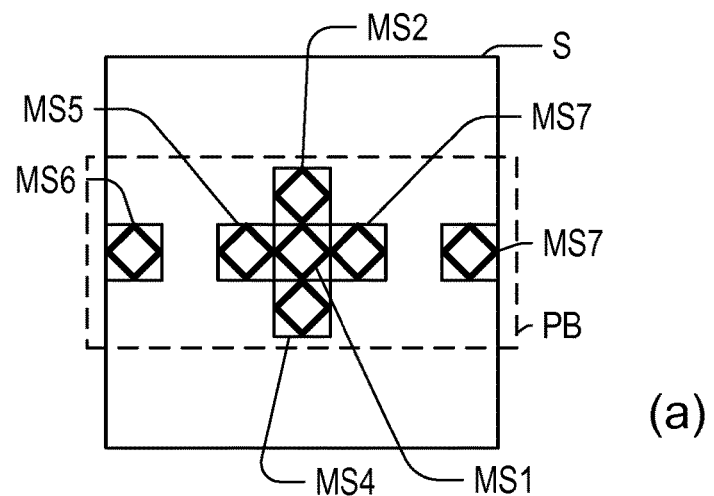
FIG. 11 schematically depicts two exemplary mask sensor apparatuses, each comprising a plurality of mask sensor modules.
Figure 11:
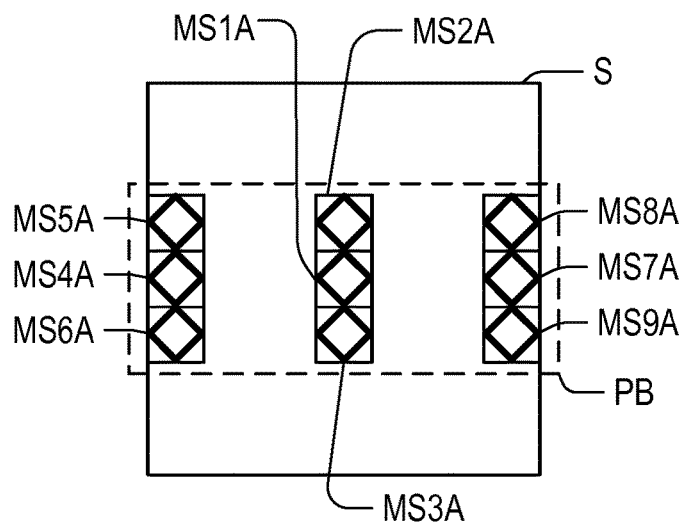

An alternative example of the mask sensor apparatus is shown in FIG. 11(*b*). In this alternative embodiment three modules MS1A-MS3A are located at the centre of the mask substrate S and separated from each other in the Y-direction (i.e. the scanning direction of the lithographic apparatus). The separation between each adjacent module MS1A-MS3A may correspond with a 120 degree relative phase offset. Three modules MS4AMS6A are located along or adjacent to one edge of the mask substrate S and three modules MS7A-MS9A are located along or adjacent to an opposite edge of the mask substrate. In each case the separation between each adjacent module MS4A-MS6A, MS7A-MS9A may correspond with a 120 degree relative phase offset. The embodiment shown on the right hand side of FIG. 10 allows measurement of the substrate grating position with three degrees of freedom X,Y,Z and measurement of the substrate grating rotation with three degrees of freedom Rx, Ry & Rz to be performed in a single measurement cycle.

In general terms, in order to determine the phase of an oscillating signal multiple intensity measurements with different substrate to mask alignments are needed. Three parameters are fitted to the oscillating signal: offset, modulation & phase. It is for this reason that three intensity measurements are needed (e.g. separated by 120 degrees).

The intensity measurements may be sequentially (same detector over time) or in parallel (multiple detectors at a single time). In the latter case a plurality of detectors are needed.

It will of course be realized that the mask sensor apparatuses described above are exemplary only. It will, of course, be realized that it is possible to measure deviations using other arrangements.

Figure 12:
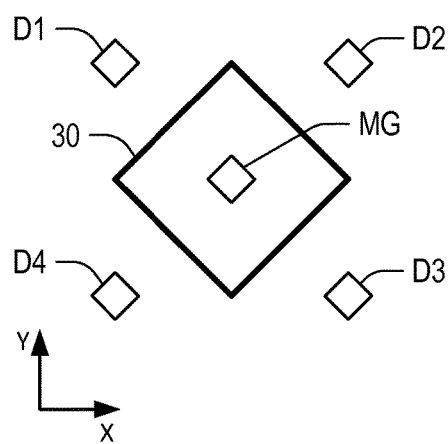
FIG. 12 depicts one of the mask sensor modules.
Figure 12:
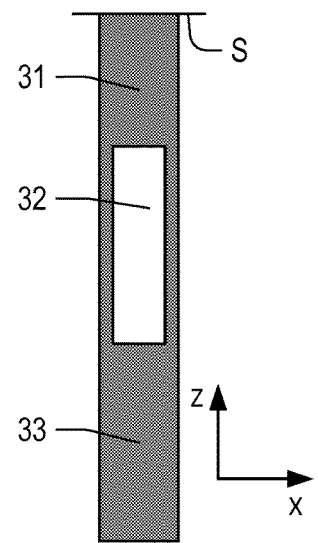

FIG. 12 schematically shows one mask grating and detector module in more detail. From FIG. 12 it may be seen that the mask grating MG is orientated at 45 degrees relative to the X and Y axes, and similarly the detectors D1-4 are also oriented at 45 degrees relative to the X and Y axes. As is explained further below, orienting the mask grating MG and the detectors D1-4 in this manner allows both X and Y positions of the substrate grating to be measured during phase stepping of the substrate.

Each module of the mask sensor apparatus further comprises a tower 30 which extends downwardly from the mask substrate S. The tower comprises four walls, one of which 31 is shown viewed from one side in FIG. 12. The wall 31 is provided with an opening 32 which is dimensioned to allow transmission of radiation propagating diffracted by the mask grating MG over a predetermined range of angles. The wall 31 has a reflective surface 33 below the opening 32 which in use reflects a combination diffraction order. Referring to FIG. 12 in combination with FIGS. 8 and 10, it can be seen that in an embodiment the opening 32 may allow for transmission of an incident zero diffraction order L0 (or R0) and the reflective surface 33 may reflect a combination order L0,1, L1,−1 (or R0,1, R1,−1). The wall 31 may also block transmission of an incident second diffraction order L2 (or R2).

An exemplary measurement method and mask sensor apparatus will now be explained with reference to FIGS. 13 and 14. For illustrative purposes only, the exemplary mask sensor apparatus 1300 has three detector modules 1302 arranged in a linear configuration along a second direction (indicated by arrow 1306). It will be appreciated that the mask sensor apparatus could have any other convenient arrangement of detector modules, e.g. the arrangements shown in FIG. 11. In a first step 1401 (shown in FIG. 13(*a*)), the mask sensor apparatus is moved relative to the substrate in a first direction (as indicated by arrows 1304). During the movement, a first intensity measurement is carried out on the substrate grating. It will be realized that the relative movement between the mask sensor apparatus and substrate may be implemented in a plurality of specific ways. In one example, the substrate stage on which the substrate is placed is actuated and the mask sensor apparatus remains stationary. In another example, the mask sensor apparatus is actuated and the substrate stage remains stationary. In yet another example, the mask sensor apparatus is actuated for some degrees of freedom and the substrate stage is actuated for the remaining degrees of freedom.

In a further example, some or all of the above exemplary arrangements may be implemented. Each of the arrangements has specific advantages, and implementing several of the above exemplary arrangements allows these advantages to be taken advantage of. Some advantages may relate to other processes performed in the lithographic apparatus (e.g. determining data delay in the substrate stage and/or other parts of the lithographic apparatus).

Figure 13:
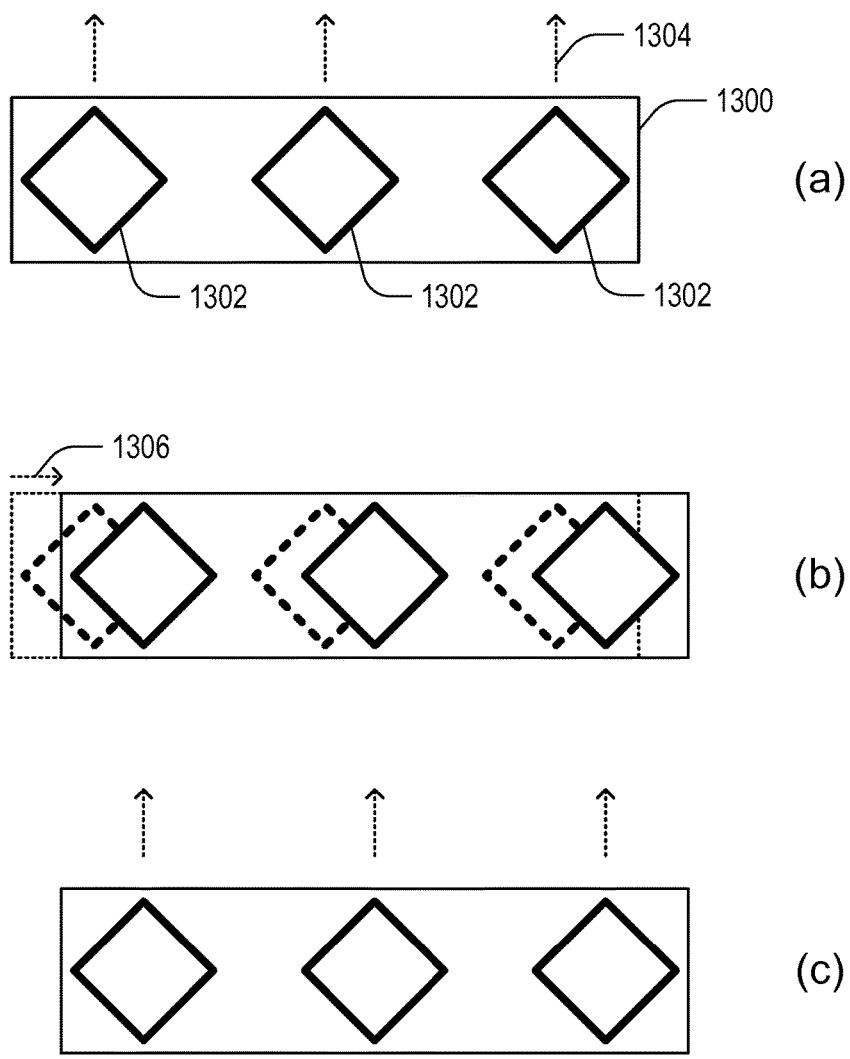
FIG. 13 depicts schematically a mask sensor apparatus according to an embodiment of the invention.
Figure 14:
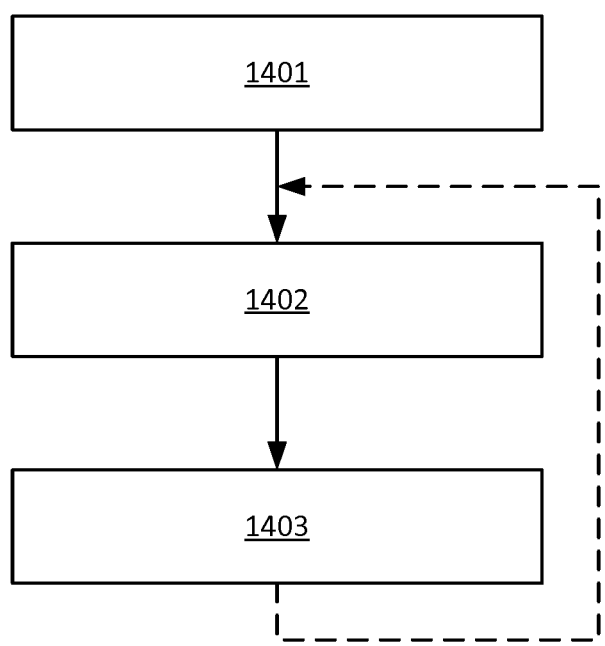
FIG. 14 depicts a method for using the mask sensor apparatus of FIG. 9.

In a second step 1402, as shown in FIG. 13(*b*), the mask sensor apparatus 1300 is displaced in a second direction. In the present example, the second direction is perpendicular to the first direction, although the second direction could in principle equally well be parallel to the first direction. The displacement may be of any suitable size. The displacement may be limited by physical constraints within the lithographic apparatus. For example, the displacement may be limited by the range of movement of either the substrate stage or the mask sensor apparatus. In one example, the range of displacement is approximately 0.5 mm in the X-direction and 2 mm in the Y-direction. In general, the size of the displacement is proportional to the spatial frequency of the errors that can be detected. In one example, the size of the displacement is chosen so as to be substantially identical to the size or frequency of a potential error. In this manner, for example, spatial high frequency content may be separated from any remaining calibration error sources, thus reducing or eliminating the impact of the high frequency content on calibration errors. In another example, the displacement is chosen to as to position the mask sensor apparatus relative to a target grating, e.g. if the mask sensor is not aligned properly with the target grating (this is particularly relevant if the target grating is part of a larger structure that comprises other types of gratings, as will be discussed in more detail with reference to FIG. 16 below).

In a third step 1403, shown in FIG. 13(c), the mask sensor apparatus moves in the first direction while performing a second intensity measurement in a similar fashion to the first intensity measurement. In some examples, the second and third steps may be repeated any suitable number of times. Performing additional measurements will increase the available number of data points available for the calibration, thereby increasing the accuracy of the calibration. However, performing additional measurements proportionally increases the time required to carry out the calibration.

In the above example, the mask sensor apparatus is moved in the first direction during the intensity measurements, and the displacement being along the second direction. In principle, however, it is equally possible to move the mask sensor apparatus in the second direction, and for the displacement to be along the second direction. Alternatively, a first set of measurements may be carried out in the first direction and a second set of measurements may subsequently be carried out in the second direction. This can e.g. be accomplished by rotating the substrate on which the target grating is provided after the first set of measurements has been carried out and before the second set of measurements is carried out.

Figure 15:
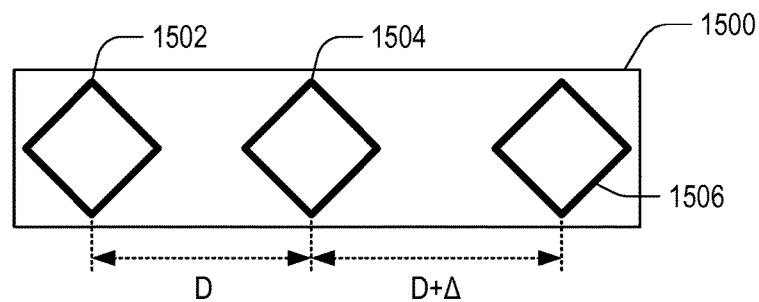
FIG. 15 depicts schematically a mask sensor apparatus according to another embodiment of the invention.

A second exemplary mask sensor apparatus 1500 will now be discussed with reference to FIG. 15. As explained above, the exemplary mask sensor apparatus 1300 of FIG. 13 has three detector modules arranged in a linear configuration, each of the detector modules being separated from neighboring detector modules by a distance D. The first 1402 and second 1404 detector modules of the second mask sensor apparatus are separated by a distance D. The second 1504 and third 1506 detector modules are separated by a distance $D_2=D+\Delta$, where the distance variation is significantly smaller than the distance, $\Delta<<D$. The distance variation $\Delta$ enables spatial high frequency content to be separated from the remaining error sources. Specifically, the size of the distance variation is directly proportional to the frequencies that may be separated by using the second mask sensor apparatus. In some examples, the distance D has a value of 2-26 mm, and the distance variation has a value of 0.1-1 mm. It should, of course, be noted that the second exemplary mask sensor apparatus 1500 may be used in conjunction with, or as an alternative to, the mask sensor apparatus described with reference to FIGS. 13 and 14. Furthermore, the skilled person will realize that, whilst a single distance variation is described above, embodiments of the mask sensor apparatus may be envisaged which comprise several distance variations, thereby enabling several specific frequencies to be separated.

Furthermore, the apparatus and method described above (with reference to FIGS. 13-15) enables deformations and scaling errors in the Z-direction to be separated and determined (which is not possible by using the known method). For example, the grating can be described as a function (e.g. a "horizontal" function based on X and Y). Hence, scaling of the grating can be seen as a derivative of the grating displacement. In turn, this displacement (in the "horizontal" direction) can be used to determine the grating scaling in the Z-direction.

Furthermore, by using the above-mentioned apparatus and method, it becomes possible to perform tilt-dependency calibration on the lithographic apparatus. In the known method, the accuracy of tilt-dependency calibrations is reduced by grid-plate deformations on a substrate. In order to perform a tilt-dependency calibration using the known method, the grid-plate deformation is extrapolated, which reduces the accuracy of the calibration.

Figure 16:
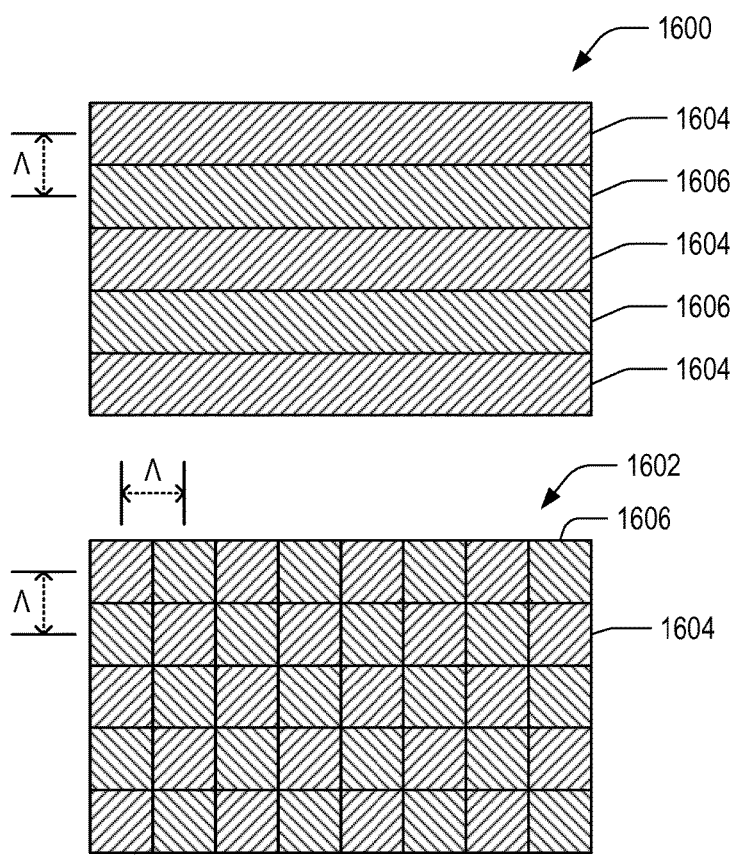
FIG. 16 depicts exemplary target grating patterns usable with a method according to the present invention.

Two exemplary grating structures 1600, 1602 that may be used with the aforementioned method and apparatus are shown in FIG. 16. The first exemplary grating 1600 comprises first portions 1604 usable by the aforementioned method and apparatus. Additionally, the first exemplary grating comprises portions 1506 usable by an alignment sensor of the lithographic apparatus. Gratings comprising a plurality of portions may be referred to as "mixed pattern gratings". The first and second portions are arranged in a linear pattern that alternates the first and second portions in a first direction. The pattern has a pitch $\Lambda$. The pitch may have any suitable value. In one example, the pitch is less than $\Lambda \leq 100$ µm. In other examples, the pitch is less than $\Lambda \leq 200$ µm. The size of the pitch may be chosen so as to be sufficiently large for the apparatus to work, but sufficiently small so as to enable high frequent defects to be measured.

The second exemplary grating structure 1602 comprises first and second portions arranged in a two-dimensional alternating pattern, i.e. a "checkerboard" pattern. The pattern may have the same pitch $\Lambda$ in both the first and the second directions, or different pitches may be used for the first and the second directions respectively.

It will be noted that the grating structures shown in FIG. 16 are exemplary only. Many other structures may be envisaged. For example, the grating structures may in some examples comprise more than two portions. Each of these portions may be usable by the aforementioned method and apparatus, or may be usable by other measurement methods and apparatuses. Additionally, it will be realized that the grating structures may have any other suitable orientations with respect to each other and with respect to the substrate on which they are patterned. Further, it will be realized that before performing a specific measurement, the substrate may be rotated any suitable amount.

It will further be noted that the boundaries between the first and second portions are exemplary only. In the above examples, the grating structures are divided equally between the first and second portions. However, in principle, it is possible to shift the boundaries dependent on a number of factors. For example, it is possible to shift the boundaries to enable more spatial averaging on reference substrates. This, in turn, may improve the accuracy of the calibrations.

In the examples described above, the target gratings have been positioned on a substrate that is mounted on a substrate table of a lithographic apparatus. It will of course be appreciated that target gratings could equally well be provided on components of the lithographic apparatus. For example, a target grating could be provided on the substrate table, such as to enable the calibration of the positioning of the substrate table.

Additionally, target gratings can for example be provided on portions of a substrate stage so as to be positioned below the edges of a substrate placed on the substrate stage. In effect, this extends the calibration range to beyond the substrate, which in turn effectively moves any edge effects to beyond the desired calibration range. The accuracy of the calibration within the desired calibration range is thereby increased.

It will be realized that the above-described methods and apparatus may be used to determine variations and defects in all degrees of freedom for both the substrate stage and the stage holding the mask apparatus (i.e. the patterning device stage).

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A method for measuring a position of a target grating with a mask sensor apparatus which comprises a plurality of detector modules each comprising a diffraction grating located at a mask side of a projection system of a lithographic apparatus and an associated detector, the method comprising:
measuring first intensities of a combination of diffraction orders diffracted from the target grating while the mask sensor apparatus is moved relative to the target grating along a first direction;
displacing the mask sensor apparatus relative to the target grating in a second direction, wherein a size of the relative displacement is proportional to a spatial frequency of a potential error; and
measuring second intensities of the combination of diffraction orders diffracted from the target grating while the mask sensor apparatus is moved relatively to the target grating along the first direction.

2. The method of claim 1, wherein the measuring intensities comprises:
using a plurality of radiation poles to illuminate the diffraction grating;
coupling at least two different resulting diffraction orders per radiation pole through the projection system; and
using the projection system to project the diffraction orders onto the target grating, such that a pair of combination diffraction orders is formed by diffraction of the diffraction orders.

3. The method of claim 1, wherein the first direction is perpendicular to the second direction.

4. The method of claim 1, wherein the displacing and measuring second intensities are repeated a number of times.

5. The method of claim 1, wherein:
the plurality of detector modules are arranged in a linear configuration;
neighboring detector modules are separated by a first distance and other neighboring detector modules are separated by a second distance, and
the second distance differs from the first distance by a distance variation which is significantly smaller than the first distance and the second distance.

6. The method of claim 1, further comprising, before the measuring first intensities, determining a position of the target grating using an alignment sensor.

7. The method of claim 6, wherein the target grating comprises first portions usable by the mask sensor apparatus and second portions usable by the alignment sensor.

8. The method of claim 1, wherein a first portion of the plurality of radiation poles is arranged in a substantially linear configuration along the first direction.

9. The method of claim 1, wherein the target grating is provided on a substrate.

10. The method of claim 1, wherein the target grating is provided on a component of the lithographic apparatus.

11. The method of claim 10, wherein the target grating is provided on a substrate stage of the lithographic apparatus.

12. A lithographic apparatus configured to carry out a method for measuring a position of a target grating with a mask sensor apparatus which comprises a plurality of detector modules each comprising a diffraction grating located at a mask side of a projection system of a lithographic apparatus and an associated detector, the apparatus comprising:
a measuring device configured to measure first intensities of a combination of diffraction orders diffracted from the target grating while the mask sensor apparatus is moved relative to the target grating along a first direction;

a displacing device configured to displace the mask sensor apparatus relative to the target grating in a second direction, wherein a size of the relative displacement is proportional to a spatial frequency of a potential error; and the measuring device is configured to measure second intensities of the combination of diffraction orders diffracted from the target grating while the mask sensor apparatus is moved relative to the target grating along the first direction.

13. A method of manufacturing devices wherein device features and target gratings are formed on a series of substrates by a lithographic process, wherein properties of the target gratings on one or more processed substrates are measured by the method for measuring a position of a target grating with a mask sensor apparatus which comprises a plurality of detector modules each comprising a diffraction grating located at a mask side of a projection system of a lithographic apparatus and an associated detector, the method comprising:

measuring first intensities of a combination of diffraction orders diffracted from the target grating while the mask sensor apparatus is moved relative to the target grating along a first direction;

displacing the mask sensor apparatus relative to the target grating in a second direction, wherein a size of the relative displacement is proportional to a spatial frequency of a potential error; and measuring second intensities of the combination of diffraction orders diffracted from the target grating while the mask sensor apparatus is moved relatively to the target grating along the first direction, and wherein the measured properties are used to adjust parameters of the lithographic process for the processing of further substrates.

14. A mask sensor apparatus comprising at least one diffraction grating usable in a method for measuring a position of a target grating with a mask sensor apparatus which comprises a plurality of detector modules each comprising a diffraction grating located at a mask side of a projection system of a lithographic apparatus and an associated detector, the apparatus comprising:

a measuring device configured to measure first intensities of a combination of diffraction orders diffracted from the target grating while the mask sensor apparatus is moved relative to the target grating along a first direction;

a displacing device configured to displace the mask sensor apparatus relative to the target grating in a second direction, wherein a size of the relative displacement is proportional to a spatial frequency of a potential error; and the measuring device is configured to measure second intensities of the combination of diffraction orders diffracted from the target grating while the mask sensor apparatus is moved relative to the target grating along the first direction.

15. A non-transitory computer-readable medium comprising machine-readable instructions for causing a processor to perform a method for measuring a position of a target grating with a mask sensor apparatus which comprises a plurality of detector modules each comprising a diffraction grating located at a mask side of a projection system of a lithographic apparatus and an associated detector, the method comprising:

measuring first intensities of a combination of diffraction orders diffracted from the target grating while the mask sensor apparatus is moved relatively to the target grating along a first direction;

displacing the mask sensor apparatus relative to the target grating in a second direction, wherein a size of the relative displacement is proportional to a spatial frequency of a potential error; and measuring second intensities of the combination of diffraction orders diffracted from the target grating while the mask sensor apparatus is moved relative to the target grating along the first direction.

* * * * *